US012628266B2

(12) United States Patent
Bei

(10) Patent No.: US 12,628,266 B2
(45) Date of Patent: May 12, 2026

(54) DISPLAY SCREEN INCLUDING FLEXIBLE PRINTED CIRCUIT AND ELECTRONIC DEVICE

(71) Applicant: VIVO MOBILE COMMUNICATION CO., LTD., Dongguan (CN)

(72) Inventor: Liangliang Bei, Dongguan (CN)

(73) Assignee: VIVO MOBILE COMMUNICATION CO., LTD., Dongguan (CN)

( * ) Notice: Subject to any disclaimer, the term of this patent is extended or adjusted under 35 U.S.C. 154(b) by 762 days.

(21) Appl. No.: 17/866,444

(22) Filed: Jul. 15, 2022

(65) Prior Publication Data

US 2022/0353986 A1 Nov. 3, 2022

Related U.S. Application Data

(63) Continuation of application No. PCT/CN2021/072197, filed on Jan. 15, 2021.

(30) Foreign Application Priority Data

Jan. 20, 2020 (CN) .......................... 202010070082.2

(51) Int. Cl.
  *H05K 1/02* (2006.01)
(52) U.S. Cl.
  CPC ........... *H05K 1/0256* (2013.01); *H05K 1/028* (2013.01)
(58) Field of Classification Search
  CPC ..... H05K 1/0256; H05K 1/028; H10K 50/844
  USPC .......................................................... 257/74
  See application file for complete search history.

(56) References Cited

U.S. PATENT DOCUMENTS

| | | | |
|---|---|---|---|
| 5,772,448 A | 6/1998 | Ekrot et al. | |
| 2003/0062527 A1 | 4/2003 | Kumar et al. | |
| 2013/0264593 A1 | 10/2013 | Nagami | |
| 2014/0138640 A1* | 5/2014 | Kim ...................... | H10K 71/40 |
| | | | 438/26 |
| 2017/0092753 A1* | 3/2017 | Prechtl .................. | H01L 23/564 |

(Continued)

FOREIGN PATENT DOCUMENTS

| | | |
|---|---|---|
| CN | 202535644 U | 11/2012 |
| CN | 103889142 A | 6/2014 |

(Continued)

OTHER PUBLICATIONS

Extended European Search Report issued in related European Application No. 21744467.8, mailed Jun. 23, 2023, 7 pages.

(Continued)

*Primary Examiner* — Norman D Richards
*Assistant Examiner* — Colin Russell McCutcheon
(74) *Attorney, Agent, or Firm* — IPX PLLC

(57) ABSTRACT

A display screen and an electronic device are provided. The display screen includes an FPC, where the FPC includes a flexible substrate, a first pin, and a second pin, and the first pin and the second pin are disposed on the flexible substrate at an interval; and the flexible substrate is provided with a charge-isolating portion that is disposed between the first pin and the second pin; or the FPC further includes a packaging portion and a moisture-isolating layer, where the packaging portion covers part of the first pin and part of the second pin, and the moisture-isolating layer is disposed between the first pin and the packaging portion and between the second pin and the packaging portion.

20 Claims, 2 Drawing Sheets

100

200   110   300

(56)        References Cited

U.S. PATENT DOCUMENTS

| | | | |
|---|---|---|---|
| 2018/0190724 A1* | 7/2018 | Kang | H10K 59/8722 |
| 2019/0004645 A1* | 1/2019 | Wang | G06F 3/041 |
| 2019/0088732 A1 | 3/2019 | Jung et al. | |

FOREIGN PATENT DOCUMENTS

| | | | | |
|---|---|---|---|---|
| CN | 106971986 A | | 7/2017 | |
| CN | 108448005 A | | 8/2018 | |
| CN | 109448617 A | * | 3/2019 | G09G 3/006 |
| CN | 111328184 A | | 6/2020 | |

OTHER PUBLICATIONS

International Search Report issued in corresponding International Application No. PCT/CN2021/072197, mailed Apr. 14, 2021, 6 pages.

First Office Action issued in related Chinese Application No. 202010070082.2, mailed Nov. 25, 2020, 5 pages.

Second Office Action issued in related Chinese Application No. 202010070082.2, mailed May 31, 2021, 4 pages.

Third Office Action issued in related Chinese Application No. 202010070082.2, mailed Oct. 8, 2021, 6 pages.

* cited by examiner

100

110        200        600        300

100

200        110        300

DISPLAY SCREEN INCLUDING FLEXIBLE PRINTED CIRCUIT AND ELECTRONIC DEVICE

CROSS-REFERENCE TO RELATED APPLICATIONS

This application is a continuation of International Application No. PCT/CN2021/072197, filed on Jan. 15, 2021, which claims priority to Chinese Patent Application No. 202010070082.2, filed on Jan. 20, 2020. The entire contents of each of the above-identified applications are expressly incorporated herein by reference.

TECHNICAL FIELD

The present disclosure relates to the field of display technologies, and in particular, to a display screen and an electronic device.

BACKGROUND

With the improvement of people's living standards and the development of communication technologies, electronic devices providing convenience for daily life of the majority of consumers become increasingly popular in people's life. A display screen of an electronic device needs to be electrically connected to an external Printed Circuit Board (PCB), to transfer an electrical signal.

In some embodiments, a plurality of signal pins of the display screen are arranged at intervals; and a great voltage difference is generated between a high-potential signal pin (during designing and arrangement of the signal pins, when a voltage difference between two adjacent signal pins is greater than 4V, a signal pin having a higher potential is defined as a high-potential signal pin) and another adjacent signal pin. When the display screen is in an environment of a reliability test for high temperature and high humidity, charges on signal pins transfer due to high humidity (one of conditions for charge transfer) in the environment and a high voltage difference (another condition for charge transfer) between adjacent signal pins in such a manner that positive charges transfer in a low voltage direction, and negative charges transfer in a high voltage direction. This leads to charge transfer between a high-potential signal pin and another adjacent signal pin after the display screen has passed the reliability test for high temperature and high humidity. Moreover, as working time of the display screen increases, charge transfer becomes increasingly serious, which finally leads to short circuit between two different signal pins, resulting in abnormal display of the display screen.

SUMMARY

The present disclosure discloses a display screen and an electronic device.

According to a first aspect, an embodiment of the present disclosure provides a display screen including a Flexible Printed Circuit (FPC), where the FPC includes a flexible substrate, a first pin, and a second pin, and the first pin and the second pin are disposed on the flexible substrate at an interval; and the flexible substrate is provided with a charge-isolating portion that is disposed between the first pin and the second pin; or the FPC further includes a packaging portion and a moisture-isolating layer, where the packaging portion covers part of the first pin and part of the second pin, and the moisture-isolating layer is disposed between the first pin and the packaging portion and between the second pin and the packaging portion.

According to a second aspect, an embodiment of the present disclosure provides an electronic device including the display screen according to the foregoing first aspect.

BRIEF DESCRIPTION OF DRAWINGS

To describe the technical solutions in the embodiments of the present disclosure or in the background art more clearly, the drawings required for describing the embodiments or the background art are described briefly below. Obviously, other drawings can be obtained by those of ordinary skill in the art based on these drawings without creative efforts.

Figure 1:
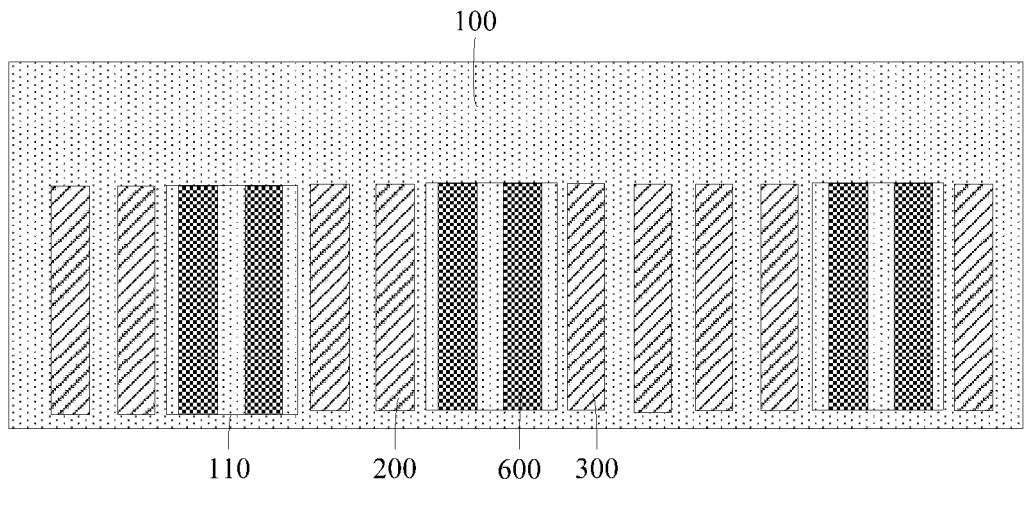
FIG. 1 is a schematic diagram of a partial structure of a display screen according to an embodiment of the present disclosure.

Reference Numerals in the Accompanying Drawings are as Follows:

100-flexible substrate, 110-charge-isolating portion, 200-first pin, 300-second pin, 400-packaging portion, 500-moisture-isolating layer, and 600-No-Connection (NC) pin.

DETAILED DESCRIPTION

The following describes the technical solutions of the present disclosure with reference to the specific embodiments of the present disclosure and the corresponding accompanying drawings. Apparently, the described embodiments are merely some rather than all of the embodiments of the present disclosure. All other embodiments obtained by a person of ordinary skill in the art based on the embodiments of the present disclosure without creative efforts shall fall within the protection scope of the present disclosure.

The technical solutions disclosed by various embodiments of the present disclosure are described in detail below with reference to the accompanying drawings.

Figure 2:
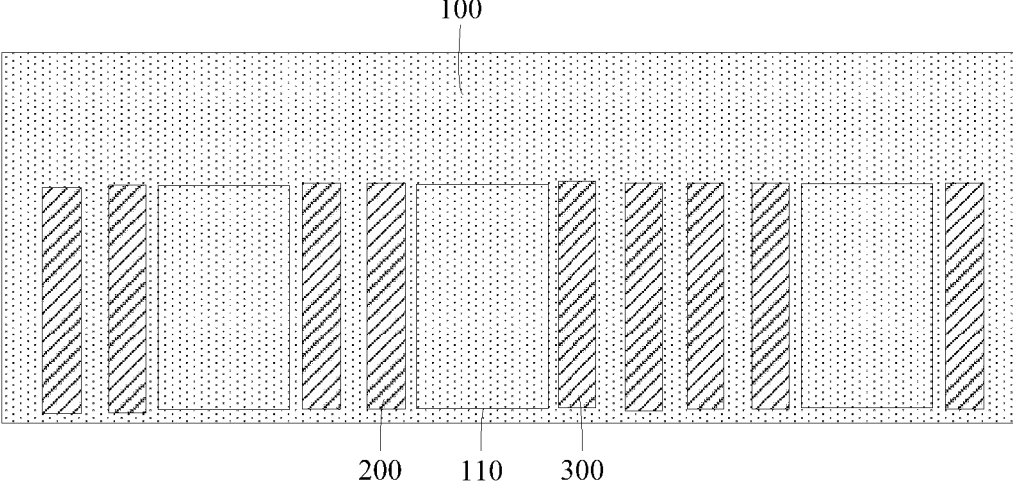
FIG. 2 is a schematic diagram of a partial structure of a display screen according to another embodiment of the present disclosure.
Figures 3, 4:
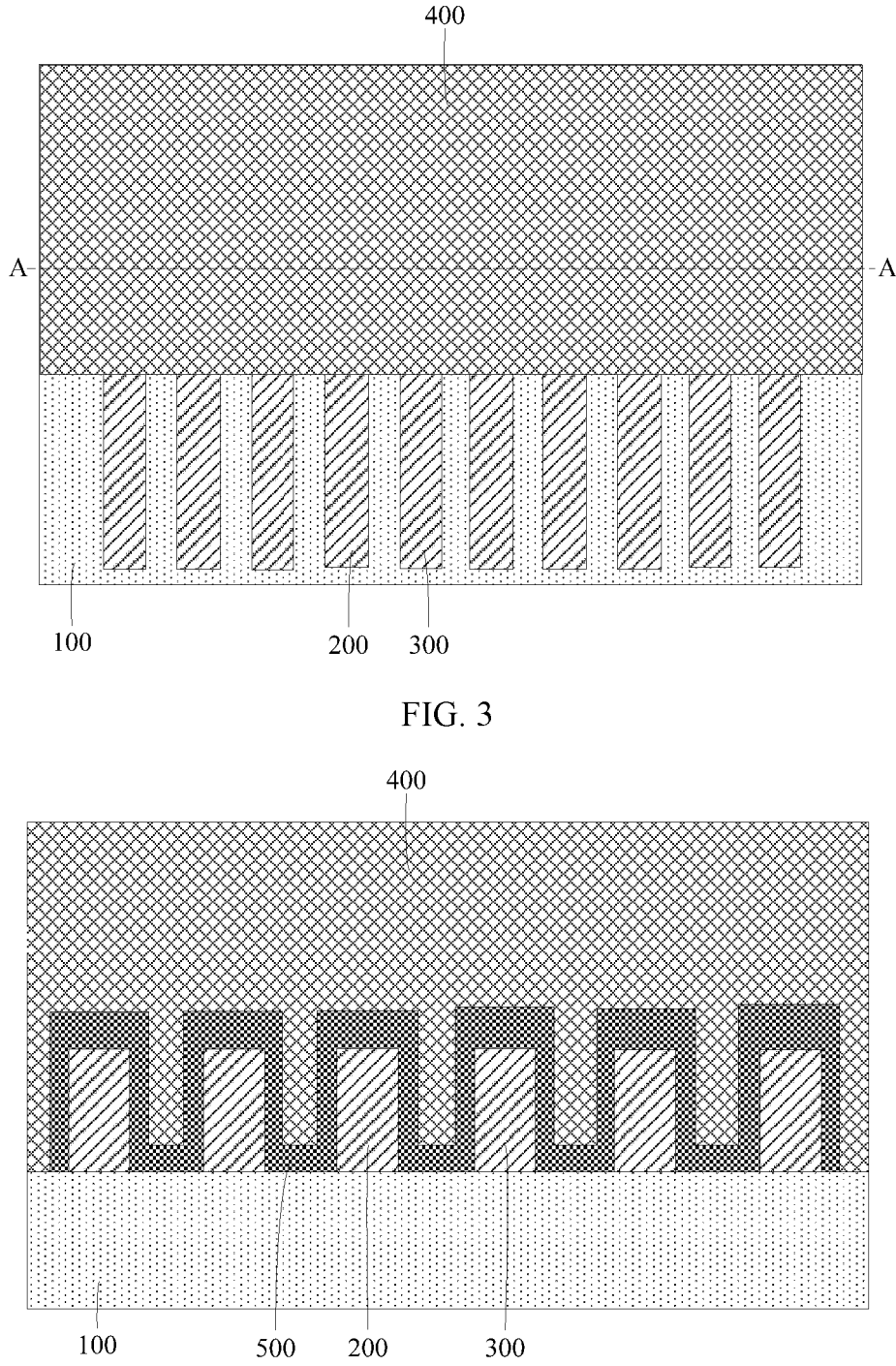
FIG. 3 is a schematic diagram of a partial structure of a display screen according to still another embodiment of the present disclosure.
FIG. 4 is a sectional view along A-A in FIG. 3.

Referring to FIG. 1 to FIG. 4, an embodiment of the present disclosure provides a display screen. The display screen includes an FPC. The FPC includes a flexible substrate 100, a first pin 200, and a second pin 300.

The FPC has the advantages of light weight, thinness, high bendability and foldability, and the like, thereby being highly favored. The FPC may be any one of a single-sided board, a double-sided board, and a multi-layer PCB. This is not limited this embodiment of the present disclosure.

The flexible substrate 100 is a basic component of the FPC, and may provide a mounting foundation for other components of the FPC. The first pin 200 and the second pin 300 are disposed on the flexible substrate 100 of the FPC at an interval. The first pin 200 and the second pin 300 may be configured to electrically connect the display screen to an external PCB, thereby implementing signal transmission between the display screen and an external component.

In some embodiments, the flexible substrate 100 is provided with a charge-isolating portion 110 that is disposed between the first pin 200 and the second pin 300. The charge-isolating portion 110 can isolate charges, thereby preventing the charges from passing through the charge-isolating portion 110. In some embodiments, the charge-isolating portion 110 may be made of an insulating material. The charge-isolating portion 110 can block a charge transfer path between the first pin 200 and the second pin 300, so that charge transfer is difficult to occur between the first pin 200 and the second pin 300. In this way, short circuit between the first pin 200 and the second pin 300 caused by charge transfer can be avoided, and reliability of the display screen can be improved.

In some embodiments, the FPC further includes a packaging portion 400. The packaging portion 400 may include adhesive and a cover film. The cover film may be made of various materials such as polyimide and polyester. Polyimide is non-flammable, and has stable geometrical dimensions, high tear strength, and a capability of withstanding soldering temperature. Polyester, also known as polyethylene terephthalate, has a physical property similar to polyimide. The adhesive has a low dielectric constant, high insulation resistance, and a low moisture absorption ratio. A type and a material of the cover film are not limited in the embodiments of the present disclosure.

The packaging portion 400 covers part of the first pin 200 and part of the second pin 300. The moisture-isolating layer 500 is disposed between the first pin 200 and the packaging portion 400 and between the second pin 300 and the packaging portion 400. A core property of the moisture-isolating layer 500 is isolating moisture or other liquids, to ensure that there is no wet environment between the first pin 200 and the second pin 300 that satisfies charge transfer. The moisture-isolating layer 500 can isolate moisture or other liquids to a large extent, to ensure that no space between the first pin 200 and the second pin 300 is connected and wet. In this way, a charge transfer path between the first pin 200 and the second pin 300 can be blocked, and charge transfer between the first pin 200 and the second pin 300 can be avoided. Therefore, this solution can resolve the problem that charge transfer occurs between adjacent signal pins.

As described above, there are a plurality of ways to block the charge transfer path between the first pin 200 and the second pin 300. In some embodiments, the charge transfer path can be blocked by disposing the charge-isolating portion 110 between the first pin 200 and the second pin 300, or by disposing the moisture-isolating layer 500 between the pins and the packaging portion 400. This is not limited in this embodiment of the present disclosure. Further, the display screen may use the two solutions at the same time. In other words, in a case that the charge-isolating portion 110 is disposed between the first pin 200 and the second pin 300, the moisture-isolating layer 500 is disposed between the first pin 200 and the packaging portion 400 and between the second pin 300 and the packaging portion 400. When the foregoing two solutions are used at the same time, an effect of blocking the charge transfer path is better, and the reliability of the display screen is further improved.

In some embodiments, the first pin 200 and the second pin 300 may be adjacent pins, and a region that is of the flexible substrate 100 and between the first pin 200 and the second pin 300 is a vacancy region, that is, there are no other pins disposed between the first pin 200 and the second pin 300. In other words, the flexible substrate 100 may be divided into a plurality of regions, and the charge-isolating portion 110 may be one of the plurality of regions. Some regions of the flexible substrate 100 are added between the first pin 200 and the second pin 300 that are adjacent to each other, so that a distance between the first pin 200 and the second pin 300 is increased, thereby blocking the charge transfer path between the first pin 200 and the second pin 300. Moreover, compared with an existing FPC, the FPC in this solution differs only in that a distance between adjacent pins is increased without changing a structure. Therefore, in this solution, the structure of the FPC is simple, so that a production process of the FPC is simple, which facilitates production of the FPC.

In some embodiments, the charge-isolating portion 110 may be provided with an NC pin 600 that is spaced from both the first pin 200 and the second pin 300. No signal is connected to the NC pin 600, so that the NC pin 600 can block the charge transfer path between the first pin 200 and the second pin 300, to prevent a charge from being transferred between the first pin 200 and the second pin 300. In this way, the following phenomenon can be avoided: Short circuit occurs between the first pin 200 and the second pin 300 because of charge transfer, which leads to abnormal display of the display screen.

In addition, when dies are closed in a production process of the display screen, because the distance between the first pin 200 and the second pin 300 is large, the display screen is stressed non-uniformly, which may make the display screen deform. As a result, the reliability of the display screen is decreased. Therefore, disposing of the NC pin 600 in this solution can ensure that the display screen is stressed uniformly when the dies are closed, thereby improving the reliability of the display screen.

Further, there may be at least two NC pins 600 that are all disposed between the first pin 200 and the second pin 300 at intervals. In this solution, there are a plurality of NC pins 600 between the first pin 200 and the second pin 300, so that the distance between the first pin 200 and the second pin 300 is increased. In addition, the plurality of NC pins 600 block a charge transfer path more completely, to achieve a more obvious blocking effect. Therefore, the charge transfer path between the first pin 200 and the second pin 300 can be further blocked, and charge transfer between the first pin 200 and the second pin 300 is almost avoided completely.

In an actual production process, the charge-isolating portion 110 is additionally disposed between the first pin 200 and the second pin 300, which causes a change of the distance between the first pin 200 and the second pin 300. As a result, a disposing manner of the flexible substrate 100 and the first pin 200 or the second pin 300 also needs to be adjusted accordingly. In addition, a production device of the FPC also needs to be improved accordingly. Compared with the foregoing FPC, the FPC in this solution has a complex production process, resulting in high costs. To resolve this problem, in some embodiments, the first pin 200, the second pin 300, and the NC pin 600 may be disposed at regular intervals. In this case, distances between the pins on the FPC are almost kept unchanged. Therefore, it is ensured that the production process or production apparatus of the FPC almost needs no adjustment or improvement, which can facilitate production of the FPC, and decrease production costs of the FPC.

Further, a distance from the first pin 200 to the second pin 300 nearest to the first pin 200 may be a first distance, a distance from the first pin 200 to the NC pin 600 adjacent thereto may be a second distance, and a ratio of the first distance to the second distance may be greater than a preset value. A range of the preset value may be determined based on experience of a designer or via experimental tests. In some embodiments, effects of blocking the charge transfer path obtained before and after adjusting the ratio of the first distance to the second distance are compared; and a ratio corresponding to a best effect of blocking the charge transfer path may be determined as the preset value. The range of the preset value may be determined in another manner. This is not limited in this embodiment of the present disclosure. In some embodiments, the ratio of the first distance to the second distance may be greater than or equal to 2, to ensure that the distance between the first pin 200 and the second pin 300 is so large that the charge transfer path between the first pin 200 and the second pin 300 can be well blocked.

In some embodiments, the distance between the first pin 200 and the second pin 300 may be 1.5 times a distance between adjacent pins of an existing FPC. Compared with the existing FPC, the solution has an advantage that the distance between the first pin 200 and the second pin 300 is large. This solution is suitable for not only a case in which the FPC is provided with an NC pin, but also a case in which the FPC is not provided with an NC pin. This is not limited in this embodiment of the present disclosure.

It should be noted that, widths of the first pin 200, the second pin 300, and the NC pin 600 may be all the same or different. This is not limited in this embodiment of the present disclosure.

When the distances between the pins of the FPC are the same, and the widths of the pins are the same, there is at least one NC pin 600 between the first pin 200 and the second pin 300 nearest to the first pin 200, and the at least one NC pin 600 can block a charge transfer path, so that the charge transfer path between the first pin 200 and the second pin 300 can be further blocked. Alternatively, when no NC pin 600 is disposed between the first pin 200 and the second pin 300 nearest to the first pin 200, the distance from the first pin 200 to the second pin 300 nearest to the first pin 200 may be increased by using the solution. Compared with an FPC on which no NC pin 600 is disposed between the first pin 200 and the second pin 300 nearest to the first pin 200, the distance between the adjacent pins of the FPC in this solution is large, so that the charge transfer path between the first pin 200 and the second pin 300 can be blocked to a great extent, thereby improving the reliability of the display screen, and avoiding a phenomenon that the display screen displays abnormally because of short circuit.

In this embodiment of the present disclosure, there may be various types of moisture-isolating layers 500. For example, the moisture-isolating layer 500 may be a plastic film or a rubber film. A type of the moisture-isolating layer 500 is not limited in the embodiments of the present disclosure. In some embodiments, the moisture-isolating layer 500 may be a waterproof glue layer. In a specific production process of the FPC, after wiring, etching, and forming of the pin, a layer of marine glue is spread, to form the moisture-isolating layer. The preparation process is simple, and a sealing property of the formed waterproof glue layer is high, so that water and moisture can be isolated more reliably. Therefore, the waterproof glue layer has a better moisture-isolating effect and a more reliable moisture-isolating property.

As described above, a core property of the moisture-isolating layer 500 is isolating moisture or other liquids, to ensure that there is no wet environment between the first pin 200 and the second pin 300 that satisfies charge transfer. To further decrease a probability that a wet environment is formed between the first pin 200 and the second pin 300, in some embodiments, the moisture-isolating layer 500 covers the first pin 200, the second pin 300, and a region between the first pin 200 and the second pin 300. In this case, all locations that are of the first pin 200 and the second pin 300 and correspond to the packaging portion 400 are covered by the moisture-isolating layer 500, so that more portions of the first pin 200 and the second pin 300 are covered by the moisture-isolating layer 500. Therefore, the probability that a wet environment is formed between the first pin 200 and the second pin 300 can be further decreased; and the charge transfer path between the first pin 200 and the second pin 300 can be further blocked, to prevent a charge from being transferred between the first pin 200 and the second pin 300. In some embodiments, the moisture-isolating layer 500 may be a one-piece covering layer, so that the moisture-isolating layer 500 is an integral component. Therefore, the moisture-isolating layer 500 covers the pins with a better effect, and can isolate moisture or other liquids better.

Further, the moisture-isolating layer 500 may further extend to edges of the flexible substrate 100 for covering, thereby having a larger covering area. Therefore, the moisture-isolating layer 500 can isolate moisture or other liquids better, and the FPC has a better water-proof and moisture-proof property.

The display screen disclosed in the present disclosure may be a Liquid Crystal Display (LCD) screen or a Light-Emitting Diode (LED) screen. This is not limited in this embodiment of the present disclosure. In some embodiments, the display screen may further include a first substrate, a second substrate, and an organic light-emitting layer disposed between the first substrate and the second substrate. Therefore, the display screen is an Organic Light-Emitting Diode (OLED) screen. An OLED screen is a device that uses a multi-layer organic film structure to generate electroluminescence, is easy to manufacture, and only requires a low drive voltage. These main features make a display effect of the OLED screen more outstanding. In addition, the OLED screen further has the advantages of lightweight, thinness, low power consumption, fast response, and high brightness, resolution, flexibility, and luminous efficiency. Therefore, the display screen can satisfy user's new demand for a display technology. A working principle of the OLED screen belongs to the prior art. For brevity, details are not repeated herein.

Based on the display screen disclosed in the embodiments of the present disclosure, an embodiment of the present disclosure further discloses an electronic device, including the display screen described in any of the foregoing embodiments.

The electronic device disclosed in this embodiment of the present disclosure may be a smart phone, a tablet computer, an ebook reader, a wearable device (for example, a smart watch), a video game console, and the like. A specific type of the electronic device is not limited in this embodiment of the present disclosure.

The embodiments of the present disclosure focus on describing differences between the embodiments, and different optimization features of the embodiments may be combined to form better embodiments provided that they are not contradictory. Considering brevity, details are not described herein again.

The foregoing descriptions are merely embodiments of the present disclosure, but are not intended to limit the present disclosure. Various changes and modifications may be made to the present disclosure by those skilled in the art. Any modifications, equivalent substitutions, improvements, and the like made within the spirit and principle of the present disclosure should be included within the scope of the claims of the present disclosure.

The invention claimed is:

1. A Flexible Printed Circuit (FPC), comprising:
   a flexible substrate;

a first pin;

a second pin, wherein the first pin and the second pin are disposed on the flexible substrate at an interval, and the flexible substrate is provided with a charge-isolating portion that is disposed between the first pin and the second pin, wherein the charge-isolating portion is made of an insulating material;

a packaging portion comprising adhesive and a cover film, and covering a part of the first pin and a part of the second pin; and a moisture-isolating layer made of a waterproof material, and comprising a first portion disposed between the first pin and the packaging portion, a second portion disposed between the second pin and the packaging portion, and a third portion disposed between the packaging portion and a region of the flexible substrate between the first pin and the second pin.

2. The FPC according to claim 1, wherein the first pin and the second pin are adjacent pins.

3. The FPC according to claim 1, wherein the charge-isolating portion is provided with a No-Connection (NC) pin that is spaced from both the first pin and the second pin.

4. The FPC according to claim 3, wherein the first pin, the second pin, and the NC pin are disposed at regular intervals.

5. The FPC according to claim 4, wherein a distance from the first pin to the second pin nearest to the first pin is a first distance, a distance from the first pin to the NC pin adjacent thereto is a second distance, and a ratio of the first distance to the second distance is greater than a preset value.

6. The FPC according to claim 3, wherein there are at least two NC pins that are all disposed between the first pin and the second pin at intervals.

7. The FPC according to claim 1, wherein the moisture-isolating layer is a waterproof glue layer.

8. The FPC according to claim 1, wherein the moisture-isolating layer covers the first pin, the second pin, and the region of the flexible substrate between the first pin and the second pin.

9. A Flexible Printed Circuit (FPC), comprising:

a flexible substrate;

a first pin;

a second pin;

a charge-isolating portion disposed between the first pin and the second pin, wherein the charge-isolating portion is made of an insulating material;

a packaging portion comprising adhesive and a cover film; and a moisture-isolating layer made of a waterproof material, wherein the packaging portion covers a part of the first pin and a part of the second pin, and the moisture-isolating layer comprises a first portion disposed between the first pin and the packaging portion, a second portion disposed between the second pin and the packaging portion, and a third portion disposed between the packaging portion and a region of the flexible substrate between the first pin and the second pin.

10. The FPC according to claim 9, wherein the moisture-isolating layer is a waterproof glue layer.

11. The FPC according to claim 9, wherein the moisture-isolating layer covers the first pin, the second pin, and the region of the flexible substrate between the first pin and the second pin.

12. The FPC according to claim 9, wherein the first pin and the second pin are disposed on the flexible substrate at an interval.

13. The FPC according to claim 12, wherein the first pin and the second pin are adjacent pins.

14. The FPC according to claim 12, wherein the charge-isolating portion is provided with a No-Connection (NC) pin that is spaced from both the first pin and the second pin.

15. The FPC according to claim 14, wherein the first pin, the second pin, and the NC pin are disposed at regular intervals.

16. The FPC according to claim 15, wherein a distance from the first pin to the second pin nearest to the first pin is a first distance, a distance from the first pin to the NC pin adjacent thereto is a second distance, and a ratio of the first distance to the second distance is greater than a preset value.

17. The FPC according to claim 14, wherein there are at least two NC pins that are all disposed between the first pin and the second pin at intervals.

18. A display screen, comprising:

a Flexible Printed Circuit (FPC), comprising:

a flexible substrate;

a first pin;

a second pin, wherein the first pin and the second pin are disposed on the flexible substrate at an interval, and the flexible substrate is provided with a charge-isolating portion that is disposed between the first pin and the second pin, wherein the charge- isolating portion is made of an insulating material;

a packaging portion comprising adhesive and a cover film, and covering a part of the first pin and a part of the second pin; and a moisture-isolating layer made of a waterproof material, and comprising a first portion disposed between the first pin and the packaging portion, a second portion disposed between the second pin and the packaging portion, and a third portion disposed between the packaging portion and a region of the flexible substrate between the first pin and the second pin;

a first substrate;

a second substrate; and an organic light-emitting layer disposed between the first substrate and the second substrate.

19. The display screen according to claim 18, wherein the first pin and the second pin are adjacent pins.

20. The display screen according to claim 18, wherein the charge-isolating portion is provided with a No-Connection (NC) pin that is spaced from both the first pin and the second pin.

* * * * *